United States Patent
Miyawaki

(10) Patent No.: US 9,455,245 B2
(45) Date of Patent: Sep. 27, 2016

(54) SEMICONDUCTOR DEVICE AND A METHOD FOR MANUFACTURING SEMICONDUCTOR DEVICE

(71) Applicant: Mitsubishi Electric Corporation, Tokyo (JP)

(72) Inventor: Katsumi Miyawaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/608,836

(22) Filed: Jan. 29, 2015

(65) Prior Publication Data

US 2015/0279760 A1 Oct. 1, 2015

(30) Foreign Application Priority Data

Mar. 27, 2014 (JP) .................. 2014-066382

(51) Int. Cl.
| | |
|---|---|
| *H01L 25/00* | (2006.01) |
| *H01L 25/065* | (2006.01) |
| *H01L 23/13* | (2006.01) |
| *H01L 23/66* | (2006.01) |
| *H01L 23/047* | (2006.01) |

(52) U.S. Cl.
CPC ............. *H01L 25/50* (2013.01); *H01L 23/047* (2013.01); *H01L 23/13* (2013.01); *H01L 23/66* (2013.01); *H01L 25/0655* (2013.01); *H01L 2224/05554* (2013.01); *H01L 2224/48091* (2013.01); *H01L 2224/49175* (2013.01)

(58) Field of Classification Search
CPC ..... H01L 23/047; H01L 23/13; H01L 23/66; H01L 25/0655; H01L 25/50; H01L 2224/05554; H01L 2224/48091; H01L 2224/49175
See application file for complete search history.

(56) References Cited

U.S. PATENT DOCUMENTS

2014/0014969 A1* 1/2014 Kunii ...................... H01L 23/66
257/77

FOREIGN PATENT DOCUMENTS

| JP | 2000-174199 A | 6/2000 |
|---|---|---|
| JP | 2008-244295 | * 9/2008 |
| JP | 2008-244295 A | 10/2008 |
| JP | 2010-183100 A | 8/2010 |
| JP | 2011-129571 A | 6/2011 |
| JP | 2013-105977 A | 5/2013 |

* cited by examiner

Primary Examiner — Armando Rodriguez
(74) Attorney, Agent, or Firm — Studebaker & Brackett PC

(57) ABSTRACT

A semiconductor device is provided with a base member having a front surface and a plurality of semiconductor chips provided on the front surface and each having a long side and a short side, the plurality of semiconductor chips being aligned so that the long sides are faced with each other. The plurality of semiconductor chips are provided diagonally, respectively, so that the adjacent semiconductor chips are inclined to the same side in a planar view of the front surface.

4 Claims, 7 Drawing Sheets

SEMICONDUCTOR DEVICE AND A METHOD FOR MANUFACTURING SEMICONDUCTOR DEVICE

BACKGROUND OF THE INVENTION

1. Field of the Invention

The present invention relates to a semiconductor device and a method for manufacturing a semiconductor device.

2. Background Art

As described in Japanese Patent Laid-Open No. 2008-244295, for example, a semiconductor device in which a plurality of semiconductor chips are mounted so as to be aligned in a V-shape in a planar view has been known. Moreover, as described in Japanese Patent Laid-Open No. 2000-174199, for example, a semiconductor device in which a semiconductor chip is mounted on a metal block with a V-shaped groove portion provided so as to be inclined in a V-shape on a sectional view has been known.

However, if the plurality of semiconductor chips are aligned in a V-shape in a planar view as in the above-described prior arts, portions close to each other and portions apart from each other are generated in the adjacent semiconductor chips. Thus, there was a problem that temperatures of the semiconductor chips become ununiform.

Moreover, if a metal block in which the V-shaped groove portion is provided is used as in the above-described prior art, there was a problem that a work of mounting the semiconductor chip on the metal block is difficult.

SUMMARY OF THE INVENTION

The present invention was made in order to solve the above-described problem and has an object to provide a semiconductor device which is reduced in size and improved so that the temperatures among the plurality of semiconductor chips are brought close to uniformity.

Another object of the present invention is to provide a semiconductor device which can realize size reduction of the semiconductor device by a simpler manufacturing method and a method for manufacturing a semiconductor device.

A semiconductor device according to a first aspect of the present invention includes a base member having a front surface, a wall portion, a first semiconductor chip, and a second semiconductor chip. The wall portion is provided on the front surface, and includes a first inner wall surface and a second inner wall surface. The first inner wall surface and the second inner wall surface are faced with each other on the front surface. The first semiconductor chip is provided on the front surface between the first inner wall surface and the second inner wall surface, and has first long sides being parallel with each other. The second semiconductor chip is provided on the front surface between the first inner wall surface and the second inner wall surface, and has second long sides being parallel with each other. The second semiconductor chip is provided adjacent to the first semiconductor chip so that one of the first long sides and one of the second long sides are faced with each other. According to the first aspect, the first semiconductor chip is provided diagonally with respect to a first imaginary line in a planar view of the front surface, the first imaginary line is in parallel to the first inner wall surface in the planar view, the second semiconductor chip is provided diagonally with respect to the first imaginary line, and the second semiconductor chip is inclined to the same side as the first semiconductor chip in the planar view.

A semiconductor device according to a second aspect of the present invention includes a base member having a front surface, a wall portion, a first semiconductor chip, and a second semiconductor chip. The wall portion is provided on the front surface, and includes a first inner wall surface and a second inner wall surface. The first inner wall surface and the second inner wall surface are faced with each other on the front surface. The first semiconductor chip is provided on the front surface between the first inner wall surface and the second inner wall surface, and has first long sides being parallel with each other. The second semiconductor chip is provided on the front surface between the first inner wall surface and the second inner wall surface, and has second long sides being parallel with each other. The second semiconductor chip is provided adjacent to the first semiconductor chip so that one of the first long sides and one of the second long sides are faced with each other. According to the second aspect, the first semiconductor chip and the second semiconductor chip are aligned so that the first long sides and the second long sides are perpendicular to a first imaginary line in a planar view of the front surface, the first imaginary line is parallel to the first inner wall surface in the planar view. A semiconductor device according to a third aspect of the present invention is provided with a base member having a front surface, and a base provided with a bottom surface and an inclined surface. The inclined surface is inclined with respect to the bottom surface. The bottom surface is connected to the front surface. A semiconductor chip is provided on the inclined surface.

A method for manufacturing a semiconductor device according to a fourth aspect of the present invention is provided with a step of preparing a base including a bottom surface and an inclined surface inclined with respect to the bottom surface and of mounting a semiconductor chip on the inclined surface and a step of mounting the bottom surface of the base after the semiconductor chip is mounted on a surface of a base member.

Other and further objects, features and advantages of the invention will appear more fully from the following description.

DETAILED DESCRIPTION OF THE PREFERRED EMBODIMENTS

Embodiment 1

Figure 1:
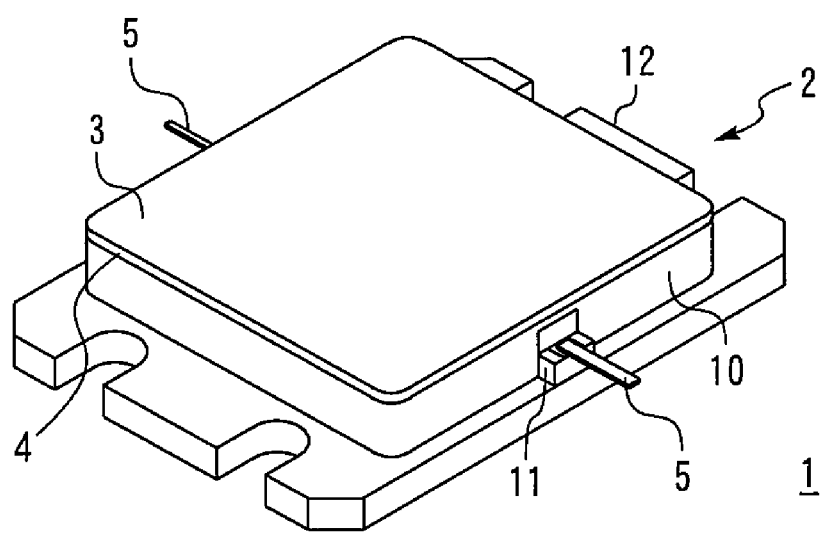
FIG. 1 is a perspective view illustrating a semiconductor device according to Embodiment 1 of the present invention.
Figure 2:
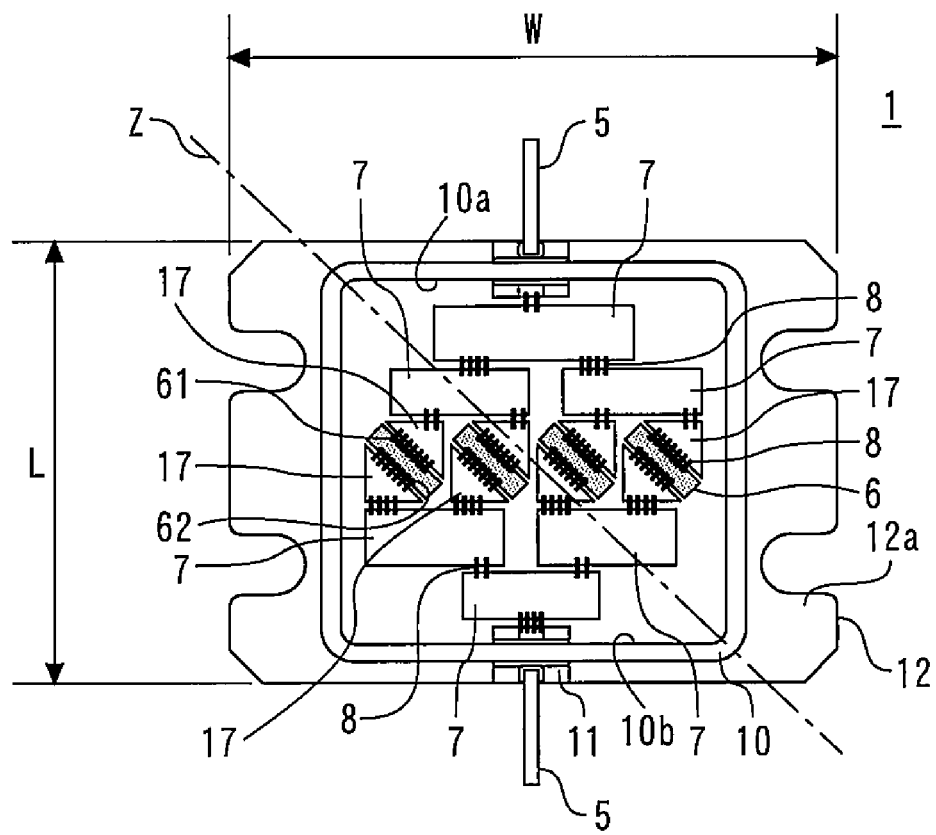
FIG. 2 is a plan view illustrating an inside of the semiconductor device according to Embodiment 1 of the present invention.
Figure 3:
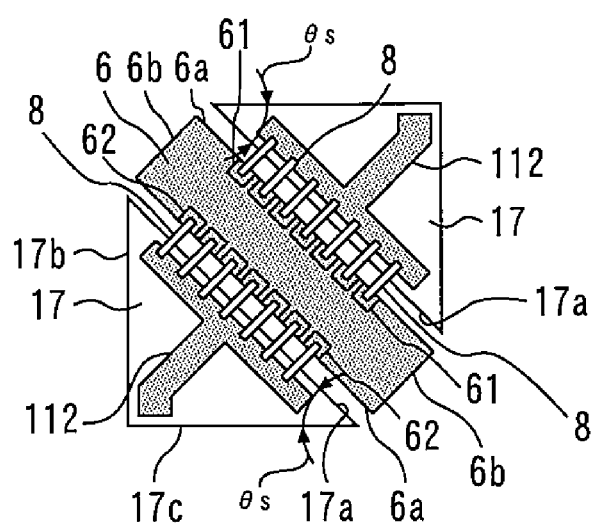
FIG. 3 is a partially enlarged view illustrating the semiconductor device according to Embodiment 1 of the present invention.

FIG. 1 is a perspective view illustrating a semiconductor device 1 according to Embodiment 1 of the present invention, and FIG. 2 is a plan view illustrating an inside of the semiconductor device 1. FIG. 3 is a partially enlarged view illustrating the semiconductor device 1 and enlarges a periphery of one semiconductor chip 6. The semiconductor device 1 is a high-frequency high-output device air-tightly sealed and accommodates the semiconductor chip 6 and the like in a semiconductor package 2. The semiconductor package 2 is constituted by metal base 12 which is a planar body, a wall portion 10 made of metal or ceramic, ceramic terminals 11 provided on facing two sides of the wall portion 10, and external lead terminals 5 penetrating the respective ceramic terminals 11. An outer shape of the semiconductor package 2 has a width W and a length L. The metal base 12 has a front surface 12a, and a plurality of the semiconductor chips 6 are provided on the front surface 12a. Each of the semiconductor chips 6 has long sides 6a and short sides 6b. That is, each semiconductor chip 6 is mounted on an inside (inside a cavity) of the wall portion 10 brazed by Ag in the front surface 12a of the metal base 12.

As illustrated in FIG. 2, the wall portion 10 is provided so as to surround a part of the front surface 12a of the metal base 12. The wall portion 10 include a first inner wall surface 10a and a second inner wall surface 10b. The first inner wall surface 10a and the second inner wall surface 10b are faced with each other on the front surface 12a. Specifically, the first inner wall surface 10a and the second inner wall surface 10b are flat, and are perpendicular to the front surface 12a. The plurality of semiconductor chips 6 are provided on the inside of the wall portion 10 in the front surface 12a. As is known from the plan view in FIG. 2, the wall portion 10 is a substantially regular square on a plan view in this embodiment. However, the present invention is not limited to that and may be a square including a rectangle or other polygons. Moreover, a corner of the regular square has R in this embodiment, but the present invention is not limited to that and may be an angled shape without R or may be chamfered. The semiconductor device 1 is provided with two external lead terminals 5. Each of the external lead terminals 5 penetrates the wall portion 10 on sides opposite to each other by sandwiching a part of the front surface 12a surrounded by the wall portion 10 and is electrically connected to the plurality of semiconductor chips 6 through a metal wire 8, matching circuit boards 7 and 17 inside it, respectively.

As illustrated in FIG. 3, on the semiconductor chip 6, a plurality of gate electrodes 61 and a plurality of drain electrodes 62 are each arranged along the long sides 6a faced with each other, and a metal wire 8 made of gold or the like is connected to each of the gate electrodes 61 and the drain electrodes 62. The semiconductor chips 6 are mounted so that the gate electrodes 61 and the drain electrodes 62 face each other between the adjacent semiconductor chips 6. In a space between the semiconductor chips 6, a matching circuit board 17 having a triangular outer shape on a plan view is mounted. On an outside thereof, the rectangular matching circuit board 7 is mounted. After each of these components is mounted, a cap 3 made of metal or ceramic is placed on the wall portion 10 and joined by a solder 4 so as to be air-tightly sealed.

Though not shown, the semiconductor chip 6 is provided with a plurality of semiconductor elements therein, and specifically, the semiconductor element is made an electric field effect transistor (that is, FET) in Embodiment 1. As illustrated in FIGS. 2 and 3, electrodes of these semiconductor elements are arranged on the long side 6a of the semiconductor chip 6. A drain, a source, and a gate of each of the FETs are repeatedly arranged in a direction of the long side 6a of the semiconductor chip 6. On the surface of the semiconductor chip 6, a first electrode 62 (which is made the drain electrode 62 in this embodiment), a second electrode (which is made a source electrode in this embodiment and not shown), and a control electrode 61 (which is made a gate electrode 61 in this embodiment) for controlling electric connection between the drain electrode 62 and the source electrode are provided. The drain electrode 62, the source electrode (not shown), and the gate electrode 61 are connected to the drain, the source, and the gate of the FET, respectively. The semiconductor element formed on the semiconductor chip 6 is not particularly limited and may be a transistor other than the FET or may be a semiconductor element other than the transistor.

Figure 4:
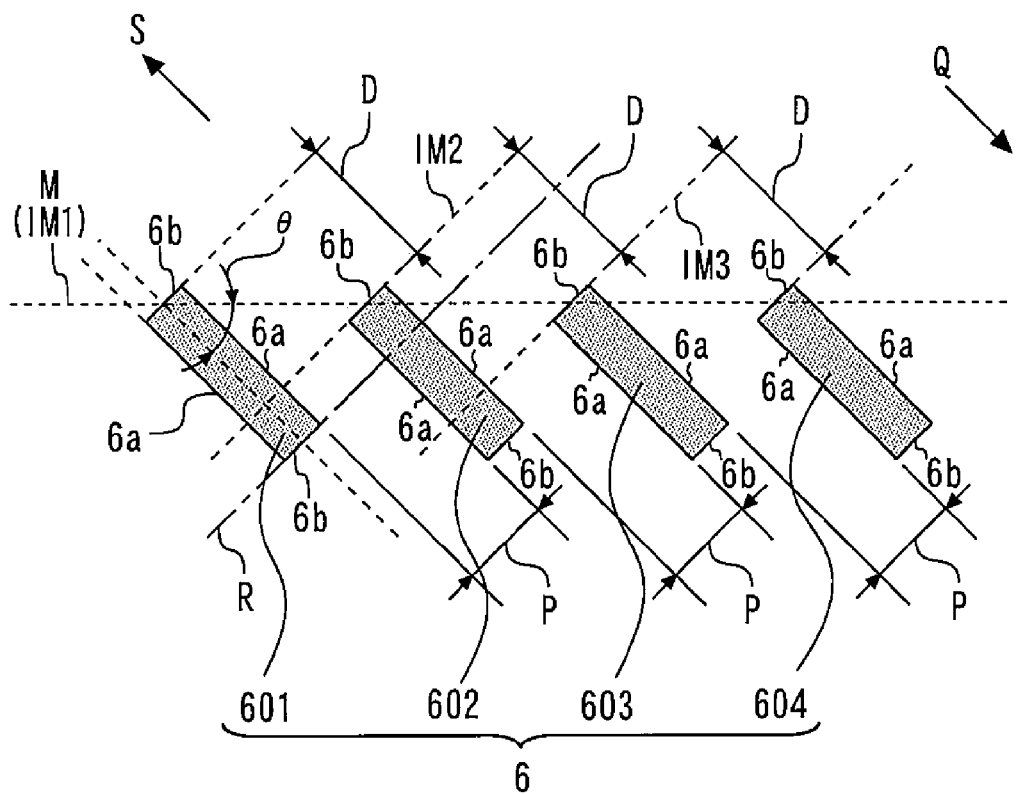
FIG. 4 is a view illustrating the semiconductor device according to Embodiment 1 of the present invention.

Between the semiconductor chips 6, the matching circuit board 17 is provided. The matching circuit board 17 is a right triangle having two sides 17b and 17c forming a right angle and a hypotenuse 17a to this right angle. Between the adjacent semiconductor chips 6, the plurality of matching circuit boards 17 are provided so that the hypotenuse 17a is faced with the long side 6a of the semiconductor chip 6. A size θs of a sharp angle of the matching circuit board 17 illustrated in FIG. 3 is 45 degrees in this embodiment. This is a preferred form corresponding to the fact that an inclination angle θ of each of the semiconductor chips 6 as will be described later by using FIG. 4 is 45 degrees. On the matching circuit board 17, a matching circuit pattern 112 is provided. The matching circuit pattern 112 is a substantially T-shaped pattern having a parallel portion 112a extending in parallel with the hypotenuse 17a. By means of the parallel portion 112a, similarly to the matching circuit board 7 having a square shape, taking out of an electric signal from the gate electrode 61 or the drain electrode 62 of the semiconductor chip 6 to the matching circuit board 17 can be performed so that the long side 6a and the metal wire 8 cross each other at a right angle, and freedom in circuit design can be improved.

FIG. 4 is an arrangement diagram of the semiconductor chips 6 in the semiconductor device 1. For the purpose of illustration, the leftmost semiconductor chip 6 on the page in FIG. 4 is referred to as a "first semiconductor chip 601", the rightmost semiconductor chip 6 on the page in FIG. 4 is referred to as a "fourth semiconductor chip 604", and two semiconductor chips 6 therebetween are referred to as a "second semiconductor chip 602" and a "third semiconductor chip 603" as shown in FIG. 4. The matching circuit board 17 is not shown. The plurality of semiconductor chips 6 are arranged so that the respective long sides 6a are faced with each other. The plurality of semiconductor chips 6 are provided diagonally, respectively, so that the adjacent semiconductor chips 6 are inclined to the same side in a planar view of the front surface 12a. The plurality of semiconductor chips 6 are arranged diagonally with inclination in the same direction, respectively, and thus, the temperatures among the semiconductor chips 6 can be brought close to uniformity while size of the semiconductor device 1 is reduced.

In Embodiment 1, a preferred arrangement form described below is satisfied.

(i) First, a virtual straight line connecting the short side 6b of each of the plurality of semiconductor chips 6 is assumed to be M. With respect to this virtual straight line M, a center axis in a longitudinal direction of each of the semiconductor chips 6 is inclined by an angle θ, respectively. Similarly to this, the long side 6a of each of the semiconductor chips 6 is also inclined by the angle θ, respectively, with respect to the virtual straight line M. The virtual straight line M is also referred to as an imaginary line "IM1" as shown in FIG. 4. It should be noted that the imaginary line IM1 is parallel to the first inner wall surface 10a in the planar view of the front surface 12a as shown in FIG. 2.

(ii) The angle θ may be an arbitrary angle smaller than 90 degrees and larger than 0 degrees, but in Embodiment 1, this angle θ is set to 45 degrees as a preferred form. Specifically, an area of the front surface 12a surrounded by the wall portion 10 in the planar view of the front surface 12a is a "quadrangle area" as shown in FIG. 2. It should be noted that the "quadrangle area" here includes substantially quadrangle area, i.e. the corners thereof are rounded, as shown in FIG. 2. The semiconductor chips 6 are provided so that, in the planar view of the front surface 12a, the long sides 6a of the semiconductor chips 6 are parallel to a diagonal line of the quadrangle area, i.e. a chain thin line "Z" in FIG. 2. By setting as above, a space can be equally reduced in each of a direction in which the long side 6a extends and a direction in which the short side 6b extends, respectively.

(iii) A reference line R illustrated in FIG. 4 is a virtual line extending along the short side 6b of the semiconductor chip 6 located on a leftmost side on the page in FIG. 4. In Embodiment 1, using the short side 6b of one semiconductor chip 6 as a reference, the plurality of semiconductor chips 6 are shifted to the sides of the respective short side 6b toward the same direction "Q" (that is, a lower right direction on the page in FIG. 4). Specifically, the first to third semiconductor chips 601, 602, 603 include short sides 6b that face in the same direction, arrowed line "S" (that is, an upper left direction on the page in FIG. 4). The short sides 6b of the semiconductor chips 601, 602, 603 are parallel with each other. An extended line of the short side 6b of the second semiconductor chip 602 in the planar view of the front surface 12a is referred to as a second imaginary line "IM2", and a part of the first semiconductor chip 601 protrudes from the second imaginary line IM2. Similarly, an extended line of the short side 6b of the third semiconductor chip 603 in the planar view of the front surface 12a is referred to as a third imaginary line "IM3", and a part of the second semiconductor chip 602 protrudes from the third imaginary line IM3. By constituting like this, arrangement of the plurality of semiconductor chips 6 is not at random but becomes arrangement approximated to a parallelogram in entirety. In order to avoid a local drop in heat radiation performance among the plurality of semiconductor chips 6, the adjacent semiconductor chips 6 are preferably arranged at equal intervals with equal intervals P. Moreover, each of the plurality of semiconductor chips 6 is preferably shifted by the same amount D in the same direction Q, respectively. That is, a protruded length of the part of the first semiconductor chip 601 from the second imaginary line IM2 is equal to a protruded length of the part of the second semiconductor chip 602 from the third imaginary line IM3. When the semiconductor chips 6 are arranged uniformly, heat radiation of the respective semiconductor chips 6 can be made favorable, and the plurality of semiconductor elements built in the respective semiconductor chips 6 can be brought to a uniform temperature, respectively.

Within a range not departing from the gist of the present invention, various variations can be applied to the semiconductor device 1 according to the above-described Embodiment 1.

For example, the arrangement of the plurality of semiconductor chips 6 is not limited to the above-described preferred form. A variation of the inclination of the semiconductor chip 6 will be explained, and the above-described angle θ illustrated in FIG. 4 may be any angle other than 45 degrees, and the angle θ may be an arbitrary angle selected within an angle range smaller than 90 degrees and larger than 0 degrees. For example, inclination can be set by an angle such as approximately 30 degrees or approximately 60 degrees instead of 45 degrees. Moreover, the inclinations of the respective semiconductor chips 6, that is, the angles θ do not have to be the same but the adjacent semiconductor chips 6 may be inclined by different angles θ as long as the directions of the inclinations are the same.

Figure 5:
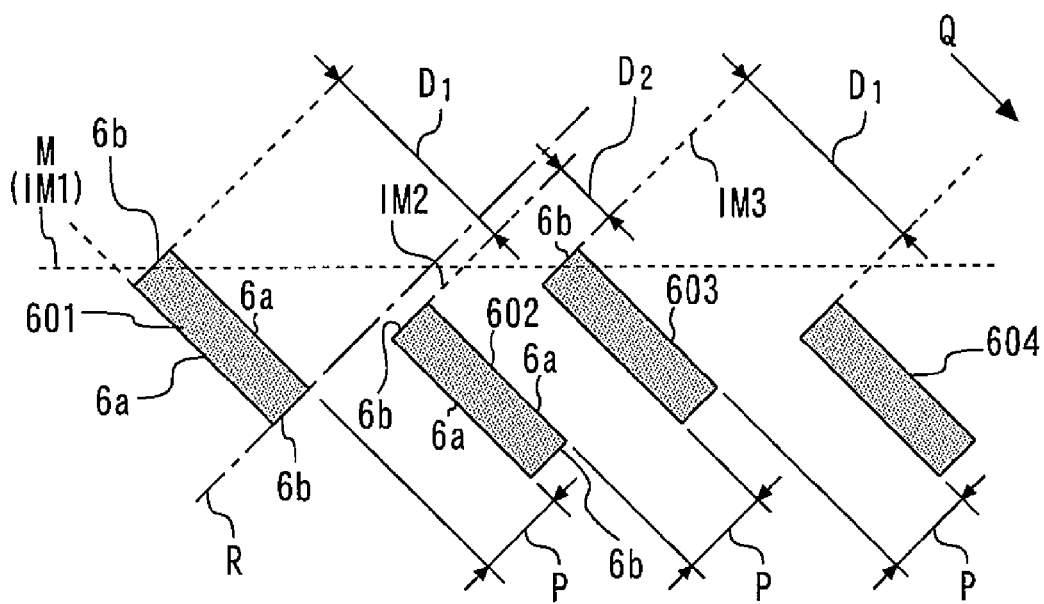
FIG. 5 is a view illustrating the semiconductor device according to Embodiment 1 of the present invention.

Moreover, in Embodiment 1, the four semiconductor chips 6 are shifted toward the same direction Q side by an equal shift amount D. However, the present invention is not limited to that. For example, as illustrated in FIG. 5, the plurality of semiconductor chips 6 may be shifted alternately so that the adjacent semiconductor chips 6 are shifted alternately by different amounts D1 and D2. Alternatively, for example, the semiconductor chip 6 arranged by being shifted in a direction opposite to the direction Q from the reference line R may be included. The matching circuit board 17 is not illustrated in FIG. 5, either, but actually, the matching circuit board 17 is provided between the semiconductor chips 6.

Moreover, the shape of the matching circuit board 17 is not limited to that in the above-described preferred form. That is, in Embodiment 1, each of the semiconductor chips 6 is inclined by 45 degrees so as to form the outer shape of the matching circuit board 17 as an isosceles right triangle. However, the present invention is not limited to that, and the shape of the matching circuit board 17 may be formed as a right triangle in which lengths of two sides other than the hypotenuse are different from each other in conformity to the size of the angle θ by which the semiconductor chip 6 is inclined. That is, if the inclination angle θ of the semiconductor chip 6 is 45 degrees, the matching circuit board 17 is preferably formed as an isosceles right triangle, while if the angle θ is an angle other than 45 degrees, θs also becomes an angle other than 45 degrees. A high-frequency circuit (that is, the matching circuit pattern 112) is formed on the matching circuit board 17. By considering ease of taking out a signal from the semiconductor chip 6 and uniformity of an electrical length, designing is easy if the matching circuit board 17 is formed as an isosceles right triangle. However, if the package width W is to be further reduced, the inclination angle θ of the semiconductor chip 6 may be made larger than 45 degrees, and a right triangle with a sharp angle θs made smaller in accordance with that may be employed. Moreover, the shape of a matching circuit board 17 does not have to be a triangle or the like, and a rectangular matching circuit board similar to the matching circuit board 7 may be arranged between the two semiconductor chips 6 with the same inclination as them.

Figure 6:
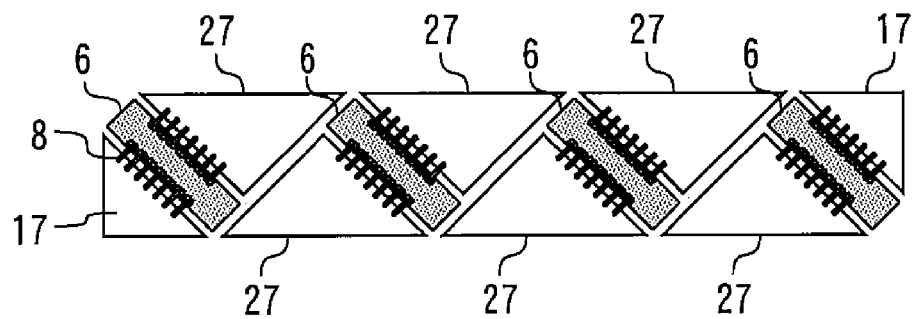
FIG. 6 is a view illustrating a variation of the semiconductor device according to Embodiment 1 of the present invention.
Figure 7:
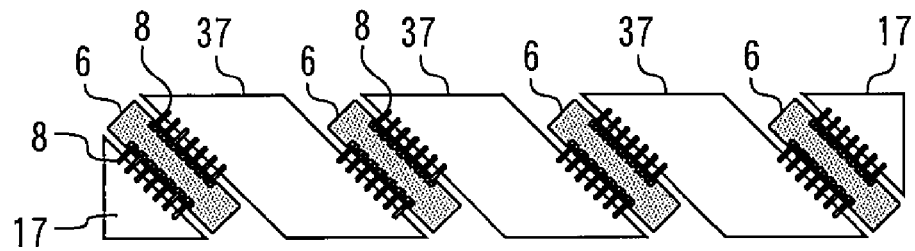
FIG. 7 is a view illustrating a variation of the semiconductor device according to Embodiment 1 of the present invention.

FIGS. 6 and 7 are diagrams illustrating variations of the semiconductor device 1. As illustrated in FIG. 6, a triangular matching circuit board 27 may be provided. Alternatively, as illustrated in FIG. 7, a parallelogram matching circuit board 37 may be provided.

Embodiment 2

Figure 8:
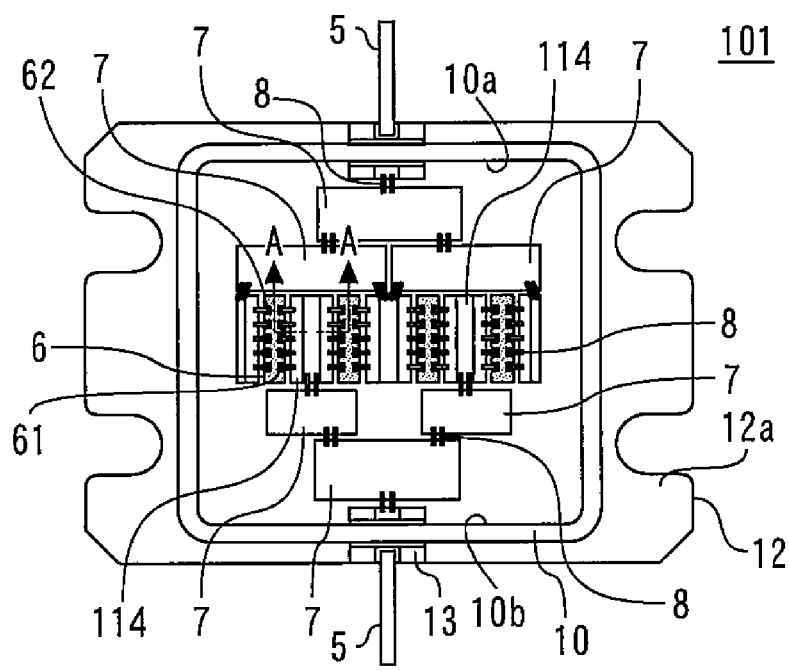
FIG. 8 is a plan view illustrating an inside of a semiconductor device according to Embodiment 2 of the present invention.

FIG. 8 is a plan view illustrating an inside of a semiconductor device 101 according to Embodiment 2 of the present invention. An appearance of the semiconductor device 101 is the same as that of the semiconductor device 1 illustrated in FIG. 1. Moreover, the same reference numerals are given to configurations similar to or corresponding to those in the semiconductor device 1, and the explanation will be omitted. In the semiconductor device 101, a plurality of the semiconductor chips 6 are arranged so that the respective long sides 6a are faced with each other and arranged so that the long sides 6a of the adjacent semiconductor chips 6 are in parallel. Between the semiconductor chips 6, a rectangular matching circuit board is provided, and in Embodiment 2, specifically, a laminated matching circuit board 114 is provided. The respective long sides 6a of the plurality of semiconductor chips 6 and long sides of the laminated matching circuit board 114 are arranged so as to face each other. A lower board 114b is connected to the drain electrode 62 or the gate electrode 61 of each of the semiconductor chips 6 through the metal wire 8. The semiconductor chip 6, the laminated matching circuit board 114, the matching circuit board 7, and the external lead terminal 5 are connected to each other by using the metal wire 8, and by electrically connecting them, an electric signal is taken out.

Figure 9:
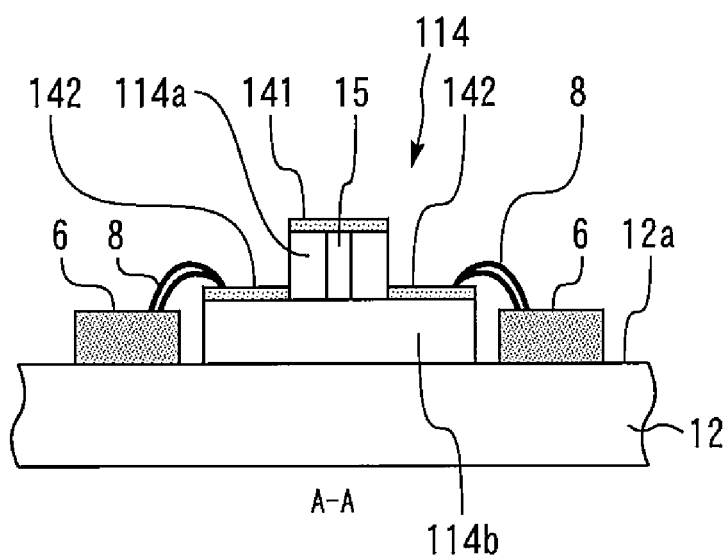
FIG. 9 is a view illustrating the semiconductor device according to Embodiment 2 of the present invention.

FIG. 9 is a diagram illustrating the semiconductor device 101 according to Embodiment 2 of the present invention and is a sectional view along A-A line in FIG. 8. The laminated matching circuit board 114 is formed by laminating an upper board 114a and the lower board 114b. The lower board 114b is provided on the front surface 12a of the metal base 12 and is provided with a lower circuit pattern 142 constituting the matching circuit. The upper board 114a has a width smaller than that of the lower board 114b, is laminated on the lower board 114b, and is provided with an upper circuit pattern 141 constituting the matching board. The upper board 114a is provided with a through hole 15. The through hole 15 connects the upper circuit pattern 141 and the lower circuit pattern 142. The number of board laminations of the laminated matching circuit board 114 is not limited to 2 but the laminated matching circuit board 114 may be constituted by laminating three or more boards. By means of the laminated matching circuit board 114, the matching circuit can be formed three-dimensionally, and a dimension in a planar direction of the semiconductor device 101 (that is, the package width W and the package length L) can be reduced.

Figure 10:
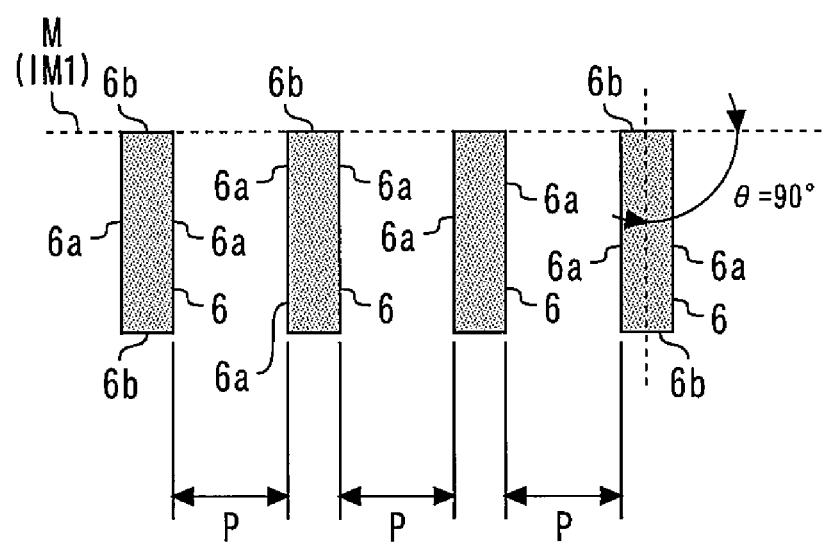
FIG. 10 is a view illustrating the semiconductor device according to Embodiment 2 of the present invention.

FIG. 10 is an arrangement diagram of the semiconductor chip 6 in the semiconductor device 101 according to Embodiment 2 of the present invention. In the semiconductor device 101, the respective long sides 6a of the plurality of semiconductor chips 6 form 90 degrees to the virtual straight line M connecting the respective short sides 6b of the plurality of semiconductor chips 6. That is, the semiconductor chips 6 are aligned so that the long sides 6a are perpendicular to the first imaginary line IM1 in the planar view of the front surface 12a. A virtual line connecting connection portions where the two external lead terminals 5 are connected to the wall portion 10 is in parallel with the long side 6a of the semiconductor chip 6. Since the semiconductor chips 6 are arranged by rotating them by 90 degrees on the basis of the virtual straight line M, the package width W of the semiconductor chip 6 can be suppressed. Since the chips are mounted at certain intervals in a direction in parallel with the external lead terminals 5, the interval P of the semiconductor chips 6 can be made uniform. Heat radiation is not interfered by the adjacent semiconductor chips 6, and favorable heat radiation performance is ensured. The temperatures of the plurality of semiconductor elements inside the semiconductor chip 6 are made uniform.

Embodiment 3

Figure 11:
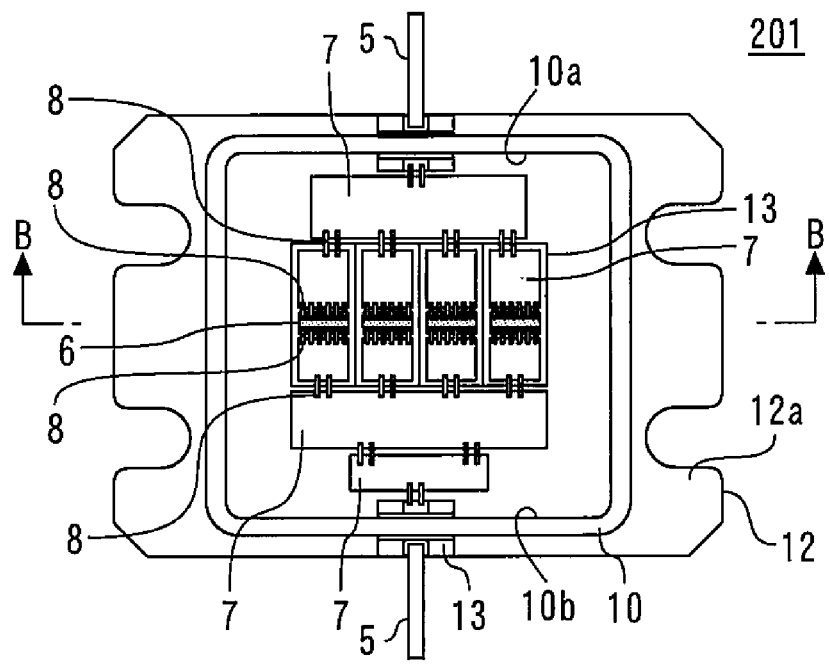
FIG. 11 is a plan view illustrating an inside of a semiconductor device according to Embodiment 3 of the present invention.
Figure 12:
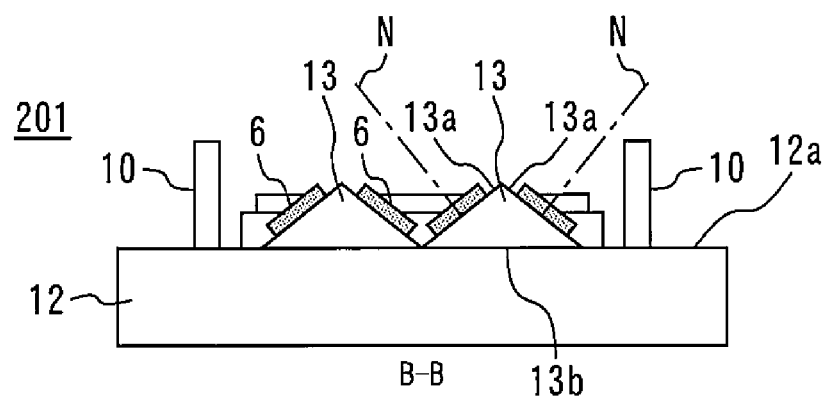
FIG. 12 is a view illustrating the semiconductor device according to Embodiment 3 of the present invention.

FIG. 11 is a plan view illustrating an inside of a semiconductor device 201 according to Embodiment 3 of the present invention. FIG. 12 is a diagram illustrating the semiconductor device 201 and is a sectional view along B-B line in FIG. 11. An appearance of the semiconductor device 201 is the same as that of the semiconductor device 1 illustrated in FIG. 1. The same reference numerals are given to configurations similar to or corresponding to those in the semiconductor device 1, and the explanation will be omitted. The semiconductor device 201 according to Embodiment 3 is different from the Embodiments 1 and 2 in a point that it is provided with a base 13. The base 13 is provided with a bottom surface 13b and an inclined surface 13a inclined with respect to the bottom surface 13b, and the bottom surface 13b is connected to the front surface 12a of the metal base 12. The semiconductor chip 6 is provided on the inclined surface 13a. By mounting the matching circuit boards 7 on both sides of the long side 6a of the semiconductor chip 6, the package width W can be reduced more than mounting by arranging them simply in a planar state on the semiconductor package 2. On both ends of the base 13, the matching circuit boards 7 each having a rectangular outer shape are mounted. The semiconductor chip 6, the matching circuit board 7, and the external lead terminal 5 are connected to each other by the metal wire 8 and they are electrically connected so that the electric signal can be taken out of the semiconductor chip 6.

The base 13 according to Embodiment 3 has preferable features described below.

(i) First, in order to obtain favorable heat radiation performance, a highly heat conductive material, that is, metal such as CuW and the like, for example, is preferably used for the base 13.

(ii) Moreover, it is preferable that the base 13 is provided with a plurality of the inclined surfaces 13a and that the semiconductor chip 6 is provided in each of the plurality of inclined surfaces 13a. As a result, since the plurality of components can be collectively held and transported by one base 13, easiness of assembling and size reduction of the semiconductor device 201 can be realized.

(iii) Moreover, the inclined surface 13a is preferably inclined so that the base 13 has a width wider as it gets closer to the side of the bottom surface 13b. That is because, as a result, after the bottom surface 13b is mounted on the front surface 12a of the metal base 12, bonding of the metal wire 8 on the base 13 becomes easy.

(iv) Moreover, the matching circuit board 7 is preferably provided adjacently to the semiconductor chip 6 in the inclined surface 13a. As a result, in a state in which the semiconductor chip 6 and the matching circuit board 7 are both mounted on the base 13, this base 13 can be mounted on the metal base 12, whereby assembling becomes easier.

(v) Moreover, the short side 6b of the semiconductor chip 6 is preferably directed to a direction in which the inclined surface 13a declines. That is because as a result, dimensional suppression of the package length L can be realized.

(vi) Moreover, the plurality of bases 13 preferably have angles of the inclined surfaces 13a to the bottom surfaces 13b equal to each other. That is because as a result, arrangement interval and inclination interval of the semiconductor chips 6 mounted on the individual bases 13 can be made uniform, and a heat environment can be brought close to uniformity. Particularly, the plurality of inclined surfaces 13a provided in one base 13 preferably form equal angles to the bottom surface 13b, respectively, and a section of the base 13 preferably has a prism shape of an isosceles triangle (see FIG. 12) so that those plurality of inclined surfaces 13a faced away from each other.

(vii) FIG. 12 schematically illustrates a normal line N of the inclined surface 13a. The plurality of inclined surfaces 13a are faced away from each other in a planar view of the bottom surface 13b. As a result, when the semiconductor chips 6 are mounted on the respective inclined surfaces 13a, interference with each other can be avoided.

According to Embodiment 3, by mounting the semiconductor chip 6 on the inclined surface 13a of the base 13, a mounting area of the semiconductor chip 6 can be reduced, and thus, a size increase of an outer shape of the semiconductor package 2 is suppressed, while an increase in an aspect ratio is also suppressed, and a low-cost and high-frequency/high-output device can be provided. Moreover, since the base 13 is a component separate from the metal base 12, after the semiconductor chip 6 is die-bonded to the base 13, the base 13 can be mounted on the front surface 12a of the metal base 12. That is, since the base 13 plays a role of an instrument for transport/conveyance of the semiconductor chip 6, that is, a role of a carrier, assembling of the semiconductor device 201 is facilitated.

In Embodiment 3, a plurality of the bases 13 are provided, but the present invention is not limited to that, and a merit of size reduction of the semiconductor device 201 can be obtained by providing at least one base 13. Moreover, the base 13 is provided with the plurality of inclined surfaces 13a but the present invention is not limited to that, and there may be one inclined surface 13a or three or more inclined surfaces 13a may be provided. Moreover, the base 13 has a section of an isosceles triangular shape but the present invention is not limited to that. For example, the base 13 may have a trapezoidal shape and in that case, the base 13 has a parallel surface on a side opposite to the bottom surface 13b. Moreover, a top point where the two inclined surfaces 13a intersect each other may be rounded.

Figure 13:
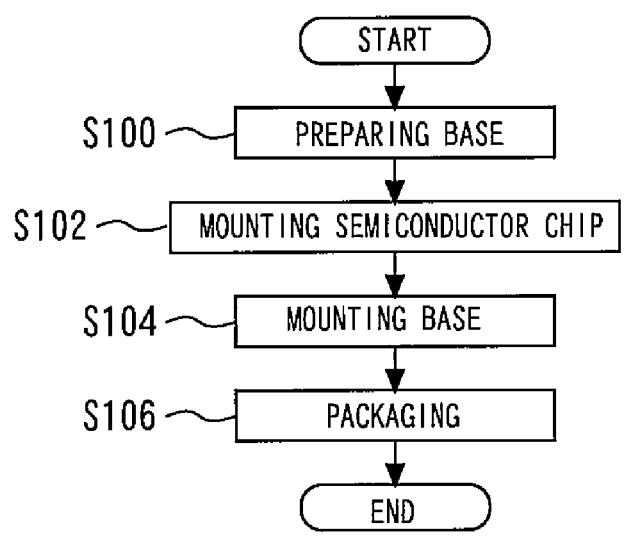
FIG. 13 is a flowchart illustrating a method for manufacturing the semiconductor device according to Embodiment 3 of the present invention.

FIG. 13 is a flowchart illustrating a method for manufacturing the semiconductor device 201. In the manufacturing method illustrated in FIG. 13, first, the base 13 is prepared (Step S100). A plurality of bases 13 having different entire sizes and shapes, different sizes, shapes, and materials of the inclined surfaces 13a and the like are preferably prepared. Depending on the difference in characteristics required for the semiconductor device 201 and the like, many types of the semiconductor chips 6 to be mounted are produced with various sizes. Since the base 13 has a relatively simple shape and can be smaller than the semiconductor package 2, a unit price can be easily kept relatively low. Thus, even if a plurality of types of the bases 13 with different sizes in order to cope with the semiconductor chips 6 with different sizes are prepared, an influence on the product cost is small. By selecting and mounting the bases 13 according to the semiconductor chips 6 with different sizes, the semiconductor package 2 can be standardized, and there is a merit that a total material cost can be reduced.

Subsequently, the step of mounting the semiconductor chip 6 on the inclined surface 13a of the base 13 is performed (Step 102). At this time, the semiconductor chip 6 is lowered in a vertical direction in a state in which the semiconductor chip 6 is held horizontal. Such a method is taken typically whether it is by an automatic machine or by a manual work. At this time in this embodiment, the base 13 is inclined so that the inclined surface 13a thereof becomes parallel with the semiconductor chip 6. As a result, the semiconductor chip 6 can be mounted on the inclined surface 13a which was made parallel with a horizontal plane by being inclined. It is easy to incline the base 13 with a size smaller than the semiconductor package 2 from the viewpoints of sizes of a rotation mechanism and a heating mechanism of an automatic mounting machine and a jig/tool.

Subsequently, after the semiconductor chip 6 is mounted, the step of mounting the bottom surface 13b of the base 13 on the front surface 12a of the metal base 12 is performed (Step S104). Subsequently, the step of packaging such as mounting of the other matching circuit board 7, bonding of the metal wire 8, and soldiering of the cap 3 for airtight sealing and the like is performed (Step S106). According to the manufacturing method according to Embodiment 3 described above, since the base 13 plays a role of a tool for transport/conveyance of the semiconductor chip 6, that is, a carrier, assembling of the semiconductor device 201 is facilitated.

The features and advantages of the present invention may be summarized as follows. According to the first aspect of the present invention, since the plurality of semiconductor chips are arranged diagonally with inclination in the same direction, respectively, the temperatures among the plurality of semiconductor chips can be brought to uniformity while a size of the semiconductor device is reduced.

According to the second aspect of the present invention, since the semiconductor chips are aligned with the directions in which the respective long sides extend, the temperatures among the plurality of semiconductor chips can be brought to uniformity while a size of the semiconductor device is reduced.

According to the third aspect of the present invention and the fourth aspect of the present invention, since the base is provided as a component separate from the base member and the semiconductor chip is mounted on the inclined surface of the base, size reduction of the semiconductor device can be realized by a simpler manufacturing method.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2014-066382, filed on Mar. 27, 2014 including specification, claims, drawings and summary, on which the Convention priority of the present application is based, is incorporated herein by reference in its entirety.

What is claimed is:
1. A semiconductor device comprising:
a base member having a front surface;
a wall portion provided on the front surface, including a first inner wall surface and a second inner wall surface, the first inner wall surface and the second inner wall surface being faced with each other on the front surface;

a first semiconductor chip provided on the front surface between the first inner wall surface and the second inner wall surface, having first long sides being parallel with each other;

a second semiconductor chip provided on the front surface between the first inner wall surface and the second inner wall surface, having second long sides being parallel with each other, and the second semiconductor chip provided adjacent to the first semiconductor chip so that one of the first long sides and one of the second long sides are faced with each other; and a third semiconductor chip provided on the front surface between the first inner wall surface and the second inner wall surface, having third long sides being parallel with each other, and the third semiconductor chip provided adjacent to the second semiconductor chip so that the second semiconductor chip being provided between the first semiconductor chip and the third semiconductor chip in the planar view, and one of the third long sides and one of the second long sides being faced with each other, wherein the first semiconductor chip is provided diagonally with respect to a first imaginary line in a planar view of the front surface, the first imaginary line is in parallel to the first inner wall surface in the planar view, the second semiconductor chip is provided diagonally with respect to the first imaginary line, and the second semiconductor chip is inclined to the same side as the first semiconductor chip in the planar view, the first semiconductor chip includes a first short side connecting the first long sides, the second semiconductor chip includes a second short side connecting the second long sides, the third semiconductor chip includes a third short side connecting the third long sides, the first short side, the second short side, and the third short side face in the same direction and are parallel with each other, a part of the first semiconductor chip protrudes from a second imaginary line which is an extended line of the second short side in the planar view, and a part of the second semiconductor chip protrudes from a third imaginary line which is an extended line of the third short side in the planar view.

2. The semiconductor device according to claim 1, wherein a protruded length of the part of the first semiconductor chip from the second imaginary line is equal to a protruded length of the part of the second semiconductor chip from the third imaginary line.

3. The semiconductor device according to claim 1, wherein
an area of the front surface surrounded by the wall portion in the planar view is a quadrangle area,
the first semiconductor chip and the second semiconductor chip are provided so that, in the planar view, the first long sides and the second long sides are parallel to a diagonal line of the quadrangle area.

4. A semiconductor device comprising:
a base member having a front surface;
a wall portion provided on the front surface, including a first inner wall surface and a second inner wall surface, the first inner wall surface and the second inner wall surface being faced with each other on the front surface;
a first semiconductor chip provided on the front surface between the first inner wall surface and the second inner wall surface, having first long sides being parallel with each other;
a second semiconductor chip provided on the front surface between the first inner wall surface and the second inner wall surface, having second long sides being parallel with each other, and the second semiconductor chip provided adjacent to the first semiconductor chip so that one of the first long sides and one of the second long sides are faced with each other;
a first matching circuit board being a right triangle having two sides forming a right angle and a first hypotenuse to this right angle; and
a second matching circuit board being a right triangle having two sides forming a right angle and a second hypotenuse to this right angle, wherein
the first semiconductor chip is provided diagonally with respect to a first imaginary line in a planar view of the front surface, the first imaginary line is in parallel to the first inner wall surface in the planar view, the second semiconductor chip is provided diagonally with respect to the first imaginary line, and the second semiconductor chip is inclined to the same side as the first semiconductor chip in the planar view, and
the first matching circuit board and the second matching circuit board are provided between the first semiconductor chip and the second semiconductor chip, the first hypotenuse faces with the one of the first long side, and the second hypotenuse faces with the one of the second long side.

* * * * *